United States Patent [19]

Van Geelen et al.

[11] Patent Number: 4,770,682
[45] Date of Patent: Sep. 13, 1988

[54] DEVICE FOR MANUFACTURING OPTICAL FIBER PREFORMS

[75] Inventors: Andreas N. Van Geelen; Jan G. J. Peelen; Hendrik Venhuizen, all of Eindhoven, Netherlands

[73] Assignee: U.S. Philips Corp., New York, N.Y.

[21] Appl. No.: 917,585

[22] Filed: Oct. 9, 1986

Related U.S. Application Data

[60] Division of Ser. No. 726,175, Apr. 23, 1985, abandoned, which is a continuation of Ser. No. 527,049, Aug. 29, 1983, abandoned.

[30] Foreign Application Priority Data

Jun. 15, 1983 [NL] Netherlands ............... 8302127

[51] Int. Cl.$^4$ ............ C03B 23/04; C03B 19/06; C23C 16/00
[52] U.S. Cl. ............................ 65/13; 65/144; 118/718; 118/730
[58] Field of Search ........... 65/3.12, 3.2, 13, 144, 65/163, 268, 271, 292; 118/730, 725, 724, 718, 623; 427/163, 167

[56] References Cited

U.S. PATENT DOCUMENTS

| | | | |
|---|---|---|---|
| 3,982,916 | 9/1976 | Miller | 65/3.12 |
| 4,312,653 | 1/1982 | Schneider et al. | 65/3.12 |
| 4,314,833 | 2/1982 | Kuppers | 65/3.12 |
| 4,316,430 | 2/1982 | Jolly et al. | 118/725 |
| 4,457,770 | 7/1984 | Faure et al. | 65/3.12 |
| 4,508,053 | 4/1985 | Eriksson | 118/730 |
| 4,528,009 | 7/1985 | Sarkar | 65/3.12 |

FOREIGN PATENT DOCUMENTS 2067181  7/1981  United Kingdom .

Primary Examiner—David L. Lacey
Assistant Examiner—Michael K. Boyer
Attorney, Agent, or Firm—Ernestine C. Bartlett

[57] ABSTRACT

In the P.C.V.D. process in principal the quartz tube need not be rotated during the deposition of the glass layers. However it has been found in practice that an improvement in the quality of the glass fibers can be obtained if the quartz tube is rotated regularly over an angle of 360°/n. n is preferably equal to an integer from 2 to 12.

3 Claims, 2 Drawing Sheets

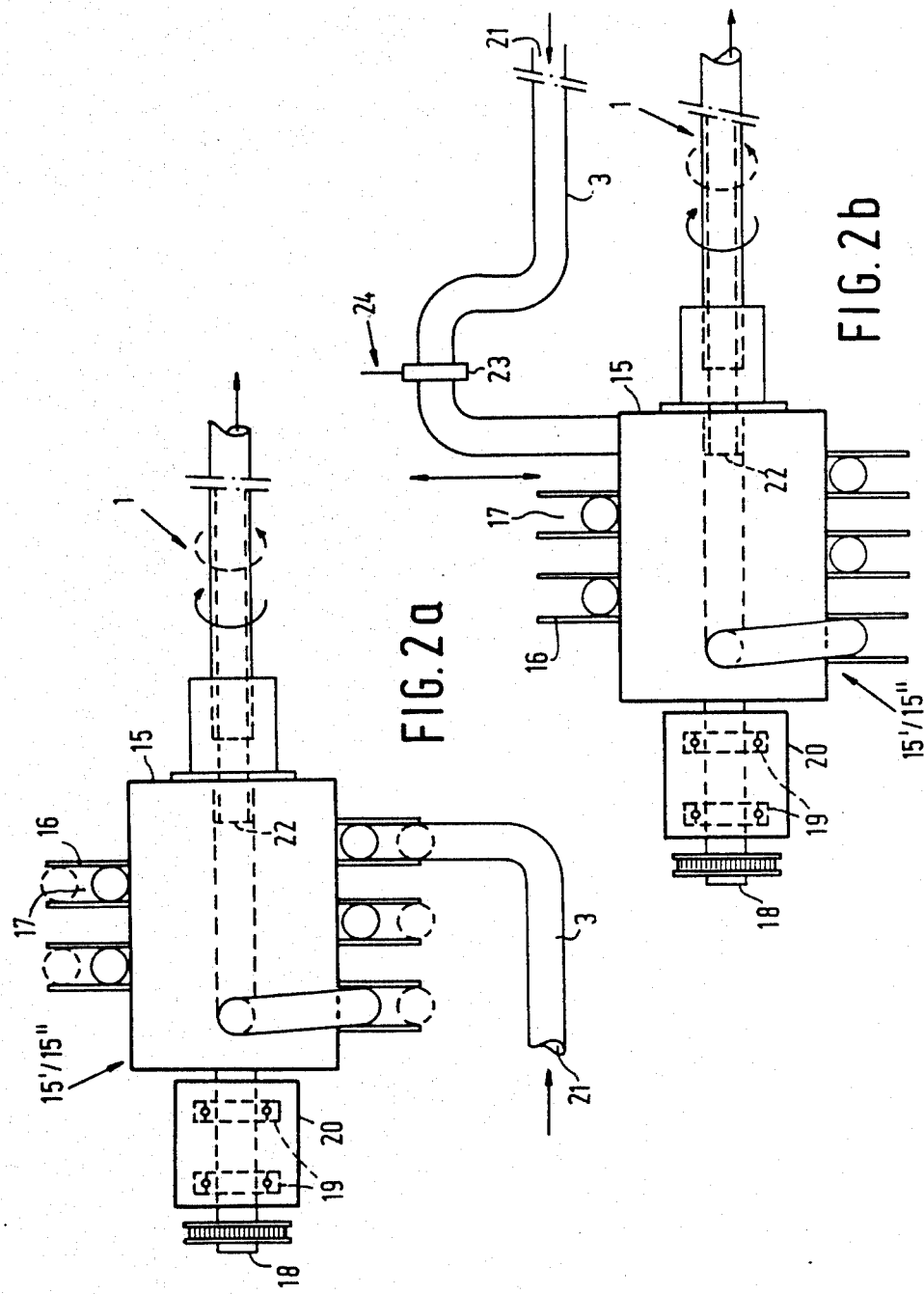

DEVICE FOR MANUFACTURING OPTICAL FIBER PREFORMS

This is a division of application Ser. No. 726,175, filed 4/23/85, now abandoned, which is a continuation of Ser. No. 527,049, filed 8/29/83, now abandoned.

BACKGROUND OF THE INVENTION

The invention relates to a method of manufacturing optical fibers. In the method, glass layers are deposited on the inside of a glass tube which is heated to a temperature between 1100° and 1300° C. The glass layers are deposited by passing a reactive gas mixture through the tube at a pressure between 0.13 and 13.33 kPa, and reciprocating a plasma in the interior of the tube. After a sufficient number of glass layers have been deposited, the tube is collapsed to form a solid preform. The preform is then drawn into an optical fiber. Glass is to be understood to mean in this connection also synthetic glass and amorphous quartz obtained from quartz crystals by fusion (i.e. fused silica and quartz glass), when doped or undoped.

The manufacture of optical fibers by this method is disclosed, inter alia, in U.S. Pat. Nos. RE 30,635 and 4,314,833. In the art, this method is known as the "nonisothermal plasma C.V.D." process (nonisothermal P.C.V.D.). In this method, glass layers are deposited directly from the gaseous phase on the inner wall of the glass tube (a heterogeneous reaction). The formation of glass soot in the gaseous phase is avoided (see in this, connection in particular, U.S. Pat. No. 4,314,833).

In principle it is not necessary in this method to rotate the glass tube so as to ensure a rotationally symmetrical glass deposition. In practice, the diffusion in the gaseous phase of charged particles formed in the plasma (ions, excited atoms and the like) to the glass wall does not seem to be biased by gravity. This in contrast with a so-called homogeneous deposition process in which glass particles are formed in the gaseous phase; the deposition of the glass particles is indeed biased by gravity.

In methods in which glass particles are formed in the gaseous phase and are deposited on the interior of a tube, the tube is rotated continuously at a rather high speed so as to ensure a rotationally symmetrical glass deposition. (See, for example, U.S. Pat. No. 4,217,027, which describes the M.C.V.D. process, in which the speed of rotation is 100 rpm). The gas pressure in these deposition processes usually is equal to or larger than atmospheric pressure. Therefore no particularly high requirements need be imposed upon the rotation couplings with respect to their gas tightness.

In industrial production of optical fibers according to the P.C.V.D. process, it sometimes appears that the deposited glass layers are sometimes not rotationally symmetric. This is detrimental because a nonsymmetrical deposition of the glass layers may lead to a reduction of the expected bandwidth.

The nonsymmetrical deposition has been found to have various causes which each individually or in combination can detrimentally influence the optical properties of the manufactured optical fiber. If during the movement of the resonant cavity for generating the plasma the glass tube is not in the center of the resonant cavity throughout its length, a rotationally nonsymmetrical plasma distribution will occur in the tube. The glass tube may have imperfections which may also result in a nonuniform deposition of the glass layers. These imperfections may be that the tube is not completely straight, or the tube does not have the same outside or inside diameter throughout its length. Furthermore, imperfections in the furnace may lead to a nonuniform heating.

Preventing or reducing the disadvantages of a rotationally nonsymmetrical deposition of the glass layers by continuous rotation of the glass tube during the deposition as used, for example, in the above-mentioned M.C.V.D. process, meets with a number of disadvantages in the present P.C.V.D. process. These disadvantages are related to the differences in performing the processes.

The M.C.V.D. process is usually carried out at pressures about equal to atmospheric pressure or greater than atmospheric pressure. Leakage in the rotational coupling used does not result in leaking-in of the ambient atmosphere into the glass tube. In contrast, the P.C.V.D. process is carried out at lower than atmospheric pressure. If the rotational coupling is not completely sealed from the atmosphere, the ambient atmosphere is drawn into the tube with all the resulting detrimental disadvantages. These disadvantages include for example, an increase of the attenuation by incorporation of water in the glass layers which are formed in the tube. Detrition products originating from the rotating parts of the coupling can also be drawn into the tube and can also detrimentally influence the properties of the optical fiber.

An adequate rotational seal which can be used continuously without the described disadvantages is difficult to realize in practice. The consideration should be taken into account that already extremely small quantities of impurities (on the order of 0.1 ppm) may give rise to a noticeable increase in the attenuation (on the order of 1 db) in the optical fiber.

SUMMARY OF THE INVENTION

It is an object of the invention to reduce the rejects in optical fibers manufactured on a factory scale by the nonisothermal P.C.V.D. process and to ensure a uniform, good optical quality as much as possible.

According to the method of the invention, the glass tube is connected to a gas supply system and to a vacuum pump via flexible tubing. During the deposition of the glass layers, the glass tube is rotated, each time the direction of movement of the plasma in the tube is reversed, over an angle equal to 360°/n, where n is an integer larger than or equal to 2. Rotation continues until the tube has been rotated through at least 360°. After the tube is rotated through 360°, the direction of rotation is reversed. This process is repeated until all the glass layers have been deposited.

In practice it has been found that a considerable improvement of the optical properties of the resulting fiber can be obtained with comparatively small values of n by means of the stepwise rotation according to the invention. In particular, the bandwidth is significantly favorably influenced. If an asymmetric deposition pattern would occur in a stationary tube, in the method according to the invention the asymmetric deposition pattern would be symmetrically distributed over the circumference of the tube over a number of successive layers. During the heating at higher temperature (following the deposition) for contracting and collapsing the tube to form a solid preform, and during drawing the fiber therefrom, a further equalization of the deposition pattern is produced by diffusion between the layers.

Suitable values of n are equal to an integer from 2 to 12, preferably smaller than 10.

The flexible tubing may consist, for example, of a reinforced hose of a synthetic resin. The tube should be one which can be reeled and which can withstand the gas mixture which is passed through the tube at the operating temperature. Corrugated stainless steel, for example a Cr-Ni-Fe steel, which is not chemically attacked by the gas mixture, are preferably used.

The invention also relates to a device for carrying out the method. This device for providing glass layers on the inside of a glass tube comprises a gas supply device which is connected to one end of the glass tube, a furnace for heating the glass tube, a resonant cavity for generating a plasma in the glass tube, and means to reciprocate the resonant cavity along the glass tube. A high-frequency generator is connected to the resonant cavity, and a vacuum pump which is connected to the other end of the glass tube.

According to the invention, the means for connecting the gas supply device and the vacuum pump, respectively, to the ends of the glass tube consists of flexible tubing. Means are provided for stepwise rotating the glass tube over a previously selected angle each time the movement of the resonant cavity along the tube is reversed.

In an embodiment of the invention which has proved suitable in practice, the means for rotating the glass tube over a previously adjusted angle consists of an electronic control unit or a stepping motor. The control unit or motor is coupled to a rotatable shaft which is arranged parallel to the tube. Two pulleys are present on the shaft. The pulleys transmit movement of the shaft to the glass tube via endless chains or belts via pulleys coupled to the glass tube.

The stepping motor is actuated via a control device. The control device switches on the motor when the resonant cavity is at the reversal points of its movement. All this can be established and controlled by electronic, optical or mechanical transducers.

BRIEF DESCRIPTION OF THE DRAWING

FIGS. 2A and 2B schematically show details of tube guide means in the device according to the invention.

DESCRIPTION OF THE PREFERRED EMBODIMENTS

Figure 1:
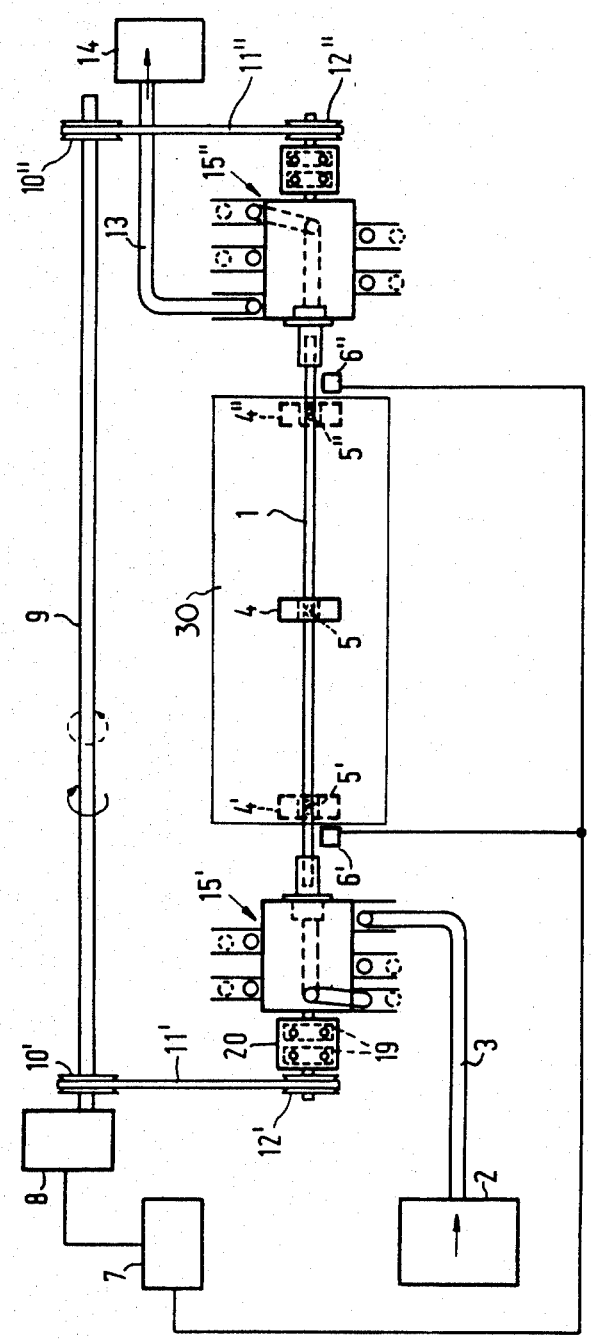
FIG. 1 schematically shows a device for providing glass layers on the inside of a glass tube according to the invention.

A gas mixture is passed through a tube 1 of quartz glass (fused silica) from a gas supply device (reservoir) 2 via a flexible tubing 3. The gas mixture has such a composition that it forms glass layers on the wall of the glass tube under the influence of a nonisothermal plasma. The gas mixture may consist, for example, of a mixture of silicon tetrachloride ($SiCl_4$) and oxygen, and may further comprise a dopant in a constant or varying quantity. The dopant may be for example, a volatile hydrogen-free fluorine compound and/or germanium tetrachloride.

The tubing 3 may consist, for example, of corrugated stainless steel having a wall thickness of 0.1 mm. A resonant cavity 4 for generating the nonisothermal plasma 5 in the tube 1 is reciprocated past the tube 1 (movement means not shown). The resonant cavity is connected to a high-frequency generator (not shown). The extreme positions of the resonant cavity 4 and the plasma 5 are denoted by 4', 5' and 4", 5", respectively. These positions are the ends of the deposition zone. When the position 4' or 4" is reached, a signal is transmitted, via an electrical or mechanical transducer 6' or 6", to a control device 7 which is connected to a stepping motor 8.

The stepping motor 8 actuates a rod 9 on which two pulleys 10' and 10" are present. Via chains 11' and 11", rod 9 drives two pulleys 12' and 12". Pulleys 12' and 12" are provided on the shaft of the tubing guide means 15' and 15".

Each time when the resonant cavity 4 reaches either of the extreme positions 4' and 4", a signal is transmitted to the control device 7. The control device 7 in turn switches on the stepping motor when a signal from one of the transducers 6' and 6" is received. The stepping motor 8 rotates the rod 9 over a previously selected angle, 360°/n, as a result of which the tube 1 is also rotated over this angle.

The tube 1 is also connected to a vacuum pump 14 via a flexible tubing 13. Tubing 13 consists of the same material as tubing 3.

During the deposition process a furnace 30 which heats the tube 1 at a temperature between 1100° and 1300° C., is present around the tube 1. The high-frequency generator and the movement means for the resonant cavity are not shown in FIG. 1 to avoid complexity in the drawing.

At the onset of the deposition of the glass layers on the inside of the tube 1, the tubes 3 and 13 are reeled on guide means 15' and 15", respectively. Each time the stepping motor 8 is switched on by the control device 7 and the tube 1 is rotated over an angle 360°/n, the radius of curvature of the turns of the tubings 3 and 13 on the bellows guide means 15' and 15" is increased. The control device 7 is adjusted so that the direction of rotation of the stepping motor 8 is reversed after the stepping motor has been switched on at least n times. The radius of curvature of the turns of the tubings 3 and 13 on the bellows guide means 15' and 15" then decreases.

FIG. 2A schematically shows the guide means 15' (or 15"), used in the device shown in FIG. 1 for reeling and unreeling a flexible tubing 3. (Like reference numerals have the same meanings as in FIG. 1. Tube 3 may also be tube 13).

The device comprises a cylinder 15. Present on the cylinder 15 is an upright edge 16 which bounds a helical groove 17. A flexible tubing 3, for example corrugated stainless steel, is reeled in the groove 17.

One possible extreme position is shown in FIG. 2A in solid lines. The tubing 3 is at the circumference of the cylindrical member 15. The other extreme position is shown in broken lines. This position is achieved after the cylinder has been rotated stepwise in that sense that the tubing 3 is unreeled from the cylinder 15, and the turns obtain a larger radius of curvature.

Cylinder 15 may be rotated by means of a shaft 18 which may be connected to an electrical control unit or a stepping motor. The shaft 18 is journalled (bearing 19) in a housing 20.

The upright edge 16 of cylinder 15 is so high that the tubing 3 cannot accidentally get out of the grooves 17. Ends 21 and 22 of the tubing 3 are hermetically connected to a gas supply device 2 (FIG. 1) and the glass tube 1, respectively. If the tubing serves to exhaust gases from the tube 1, the end 21 of the flexible tubing is connected to a vacuum pump 14.

FIG. 2B schematically shows another embodiment of guide means 15' and 15''. (Like reference numerals have the same meanings as in the preceding FIGS. 1 and 2A). Each time the shaft 18 is rotated, a part of the flexible tubing 3 is unreeled from the bellows guide means 15'. Via the noose 23 (which is connected to a counterweight (not shown) via a wire 24 extending over a guide wheel (not shown)), the flexible tubing 3 is pulled aside during unreeling. When the bellows guide means 15' is rotated in the opposite sense, the tubing 3 is reeled in again.

When the method and the device according to the invention are used, optical fibers of uniform quality are produced, despite the fact that rotation is not carried out continuously but stepwise. Up to, on average, a doubling of the bandwith was obtained by means of the method according to the invention.

What is claimed is:

1. A device for providing glass layers on the inside wall of a glass tube, said device comprising:
   nonrotating means for supplying a reactive gas mixture;
   a flexible tubing for directly connecting the supply means to a first end of the glass tube;
   a furnace for heating the glass tube;
   a resonant cavity for generating a plasma in the glass tube;
   means for moving the resonant cavity in a direction along the glass tube between a first end of a deposition zone and a second end of the deposition zone;
   means for reversing the direction of movement of the resonant cavity each time the plasma reaches an end of the deposition zone;
   a nonrotating vacuum pump;
   a flexible tubing for directly connecting the vacuum pump to a second end of the glass tube;
   means for rotating the glass tube through an angle equal to 360°/n, where n is an integer greater than or equal to 2, each time the resonant cavity reaches an end of the deposition zone, the direction of rotation being reversed each time the glass tube is rotated through at least 360°;
   first guide means located at the first end of the glass tube and rotatable with the glass tube, the flexible tubing which is connected to the first end of the glass tube being wound on the first guide means; and
   second guide means located near the second end of the glass tube and arranged to rotate with the glass tube, the flexible tubing which is connected to the second end of the glass tube being wound on the second guide means.

2. A device for providing glass layers on the inside wall of a glass tube, said device comprising:
   nonrotating means for supplying a reactive gas mixture;
   means for providing a direct, flexible fluid connection from the supply means to a first end of a glass tube;
   a furnace for heating the glass tube;
   a resonant cavity for generating a plasma in the glass tube;
   means for moving the resonant cavity in a direction along the glass tube between a first end of a deposition zone and a second end of the deposition zone;
   means for reversing the direction of movement of the resonant cavity each time the plasma reaches an end of the deposition zone; and
   means for rotating the glass tube through an angle equal to 360°/n degrees, where n is an integer greater than or equal to 2, each time the resonant cavity reaches an end of the deposition zone, the direction of rotation being reversed each time the glass tube is rotated through at least 360 degrees; and
   guide means located at the first end of the glass tube and rotatable with the glass tube, the fluid connection means which is connected to the first end of the glass tube being wound on the said guide means.

3. A device as claimed in claim 2, further comprising control means for controlling the means for rotating wherein said means for rotating the glass tube does not rotate the glass tube when the plasma is moving between the ends of the deposition zone.

* * * * *